United States Patent
Zhou et al.

(10) Patent No.: US 8,816,043 B2
(45) Date of Patent: Aug. 26, 2014

(54) DIFLUORO BENZOTRIAZOLYL SOLAR CELL MATERIAL, PREPARATION METHOD AND USE THEREOF

(75) Inventors: Mingjie Zhou, Guangdong (CN); Ping Wang, Guangdong (CN); Zhenhua Zhang, Guangdong (CN); Hui Huang, Guangdong (CN)

(73) Assignee: Ocean's King Lighting Science & Technology Co., Ltd., Guangdgon (CN)

( * ) Notice: Subject to any disclaimer, the term of this patent is extended or adjusted under 35 U.S.C. 154(b) by 0 days.

(21) Appl. No.: 14/126,896

(22) PCT Filed: Sep. 23, 2011

(86) PCT No.: PCT/CN2011/080126
§ 371 (c)(1),
(2), (4) Date: Dec. 17, 2013

(87) PCT Pub. No.: WO2013/040793
PCT Pub. Date: Mar. 28, 2013

(65) Prior Publication Data
US 2014/0090711 A1    Apr. 3, 2014

(51) Int. Cl.
*C08G 75/00* (2006.01)
(52) U.S. Cl.
USPC .......................................... 528/377; 528/380
(58) Field of Classification Search
USPC .......................... 528/377, 378, 380
See application file for complete search history.

*Primary Examiner* — Shane Fang
(74) *Attorney, Agent, or Firm* — Rosenberg, Klein & Lee

(57) ABSTRACT

The present invention relates to solar cells and discloses a difluoro benzotriazolyl solar cell material and preparation method and use thereof. The solar cell material is represented by formula (I),

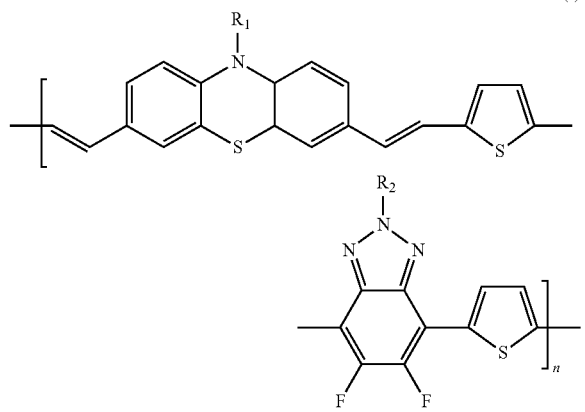

wherein both $R_1$ and $R_2$, are $C_1$ to $C_{20}$ alkyl, and n is an integer from 10 to 50. In the difluoro benzotriazolyl solar cell material, since the 1,2,3-benzotriazole solar cell material contains two fluorine atoms, the HOMO energy level is reduced by 0.11 eV, while the fluorine-substituted 1,2,3-benzotriazole has two imido groups with electron-withdrawing ability; the fluorine-substituted 1,2,3-benzotriazole is a heterocyclic compound with strong electron-withdrawing ability, and an alkyl chain can be easily introduced to the N-position of the N—H bond of the benzotriazole. The functional group of the alkyl chain can improve the solar energy conversion efficiency, thus solving the low efficiency problem of solar cells made of the solar cell material.

15 Claims, 2 Drawing Sheets

DIFLUORO BENZOTRIAZOLYL SOLAR CELL MATERIAL, PREPARATION METHOD AND USE THEREOF

FIELD OF THE INVENTION

The present disclosure relates to a field of solar cell materials, and more particularly relates to a difluoro benzotriazolyl solar cell material, a preparation method and a use thereof.

BACKGROUND OF THE INVENTION

The preparation of solar cell with low price and high performance using cheap materials has always been a hotspot and difficulty in the field of solar photovoltaic research. The current silicon cell used for ground is limited mainly because of the complex production process and the high cost. In order to reduce the cost of the cell and expand its application range, people have been looking for a new solar cell material for a long time. The organic semiconductor material has gained lots of concern due to the advantages of readily accessible raw material, inexpensive, simple preparation process, good environmental stability and photovoltaic effect and so on. Since N. S. Sariciftci, et al reported the phenomenon of photoinduced electron transferring between conjugated organic semiconductor materials and $C_{60}$ on the SCIENCE in 1992 (N. S Sariciftci, L. Smilowitz, A. J. Heeger, et al. Science, 1992, 258, 1474), numerous researches have been invested into the polymer solar cell. Although it has been rapidly developed, the conversion efficiency of the polymer solar cell is still much lower than that of the inorganic solar cell.

SUMMARY OF THE INVENTION

The present disclosure is directed to a difluoro benzotriazolyl solar cell with a high energy conversion efficiency.

A difluoro benzotriazolyl solar cell material is represented by formula (I),

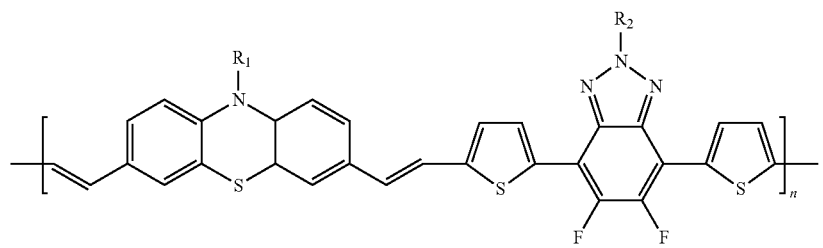

wherein $R_1$ and $R_2$ are $C_1$ to $C_{20}$ alkyl, n is an integer from 10 to 50, preferably 30 to 40.

The present disclosure is also directed to a method of preparing the difluoro benzotriazolyl solar cell material, which includes the following steps:

step S1, providing compounds A and B represented by the following formulas,

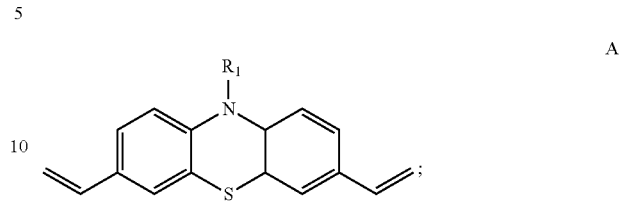

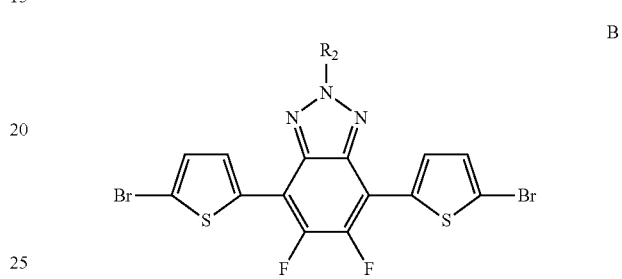

wherein $R_1$ in the compound A is $C_1$ to $C_{20}$ alkyl, $R_2$ in the compound B is $C_1$ to $C_{20}$ alkyl;

step 2, adding the compound A and the compound B to an organic solvent containing a catalyst according to a molar ratio of 1:1 in an oxygen-free environment, performing a Heck coupling reaction for 24 to 96 hours at a temperature from 70° C. to 130° C., then obtaining the difluoro benzotriazolyl solar cell material represented by formula (I):

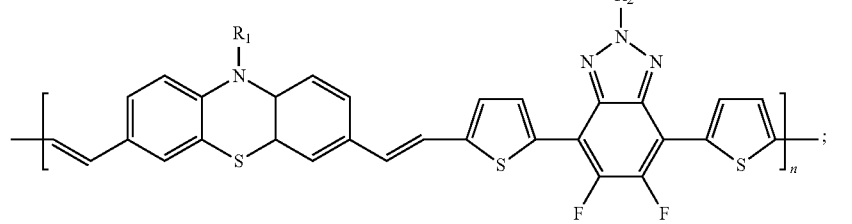

wherein n is an integer from 10 to 50.

The method of preparing the difluoro benzotriazolyl solar cell material further includes:

step S3, purifying the difluoro benzotriazolyl solar cell material obtained from step S2.

In the method of preparing the difluoro benzotriazolyl solar cell material, the catalyst in step S2 is organic palladium, or the catalyst is a mixture of organic palladium and organic phosphorus ligand. A molar ratio between the organic palladium and the compound A is 1:20 to 1:100. The organic palladium is at least one selected from the group consisting of bis(triphenylphosphine) palladium(II)dichloride, tetrakis(triphenylphosphine)platinum, and palladium acetate; the organic phosphorus ligand is tri-o-tolyl phosphine.

The organic solvent in step S2 is at least one selected from the group consisting of toluene, N,N-dimethylfonnamide, and tetrahydrofuran.

Preferably, in step S2, a reaction temperature of the Heck coupling reaction is 90° C. to 120° C., a reaction time of the Heck coupling reaction is 48 to 72 hours.

The present invention is further directed to a use of the difluoro benzotriazolyl solar cell material in an organic solar cell.

In the difluoro benzotriazolyl solar cell material, since the 1,2,3-benzotriazole solar cell material contains two fluorine atoms, the HOMO energy level of the material is reduced by 0.11 eV, while the fluorine-substituted 1,2,3-benzotriazole has two imido groups with electron-withdrawing ability; the fluorine-substituted 1,2,3-benzotriazole is a heterocyclic compound with a strong electron-withdrawing ability, and an alkyl chain can be easily introduced to the N-position of the N—H bond of the benzotriazole. The functional group of the alkyl chain can improve the solar energy conversion efficiency, thus solving the low efficiency problem of solar cells made of the solar cell material. In addition, the functional group of the alkyl chain can adjust the solubility of the difluoro benzotriazolyl solar cell material, so that the solar cell material is conducive to film forming processing, and its application range in the solar cell material or in the field of solar cell is expanded.

DETAILED DESCRIPTION OF THE EMBODIMENTS

The present disclosure provides a difluoro benzotriazolyl solar cell material represented by formula (I):

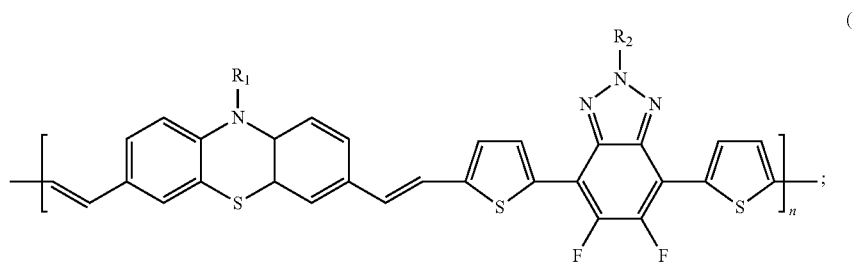

where $R_1$ and $R_2$ are $C_1$ to $C_{20}$ alkyl, n is an integer from 10 to 50, preferably from 30 to 40.

Figure 1:
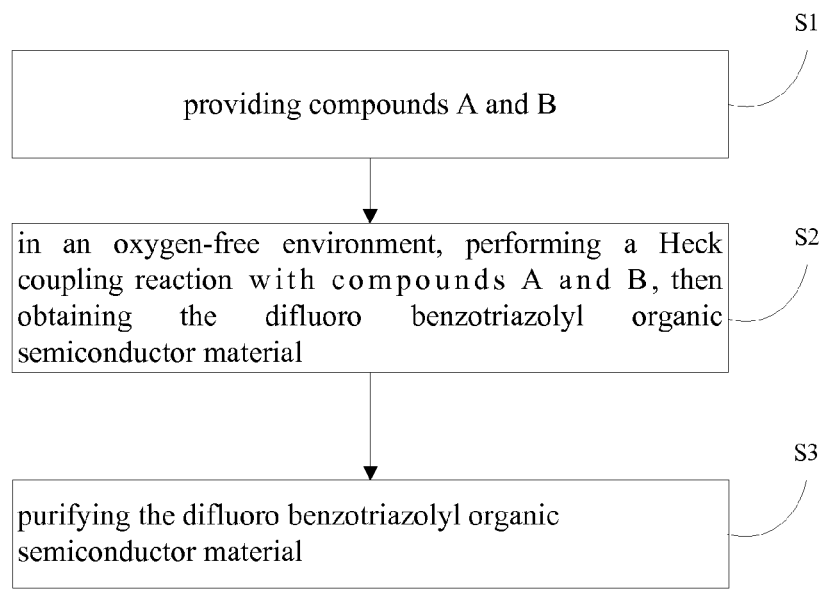
FIG. 1 is a flow chart of the method of preparing a difluoro benzotriazolyl solar cell material according to the present disclosure.

Referring to FIG. 1, a method of preparing the difluoro benzotriazolyl solar cell material includes the following steps:

Step S1, a compound A and a compound B represented by the following formulas are provided, respectively.

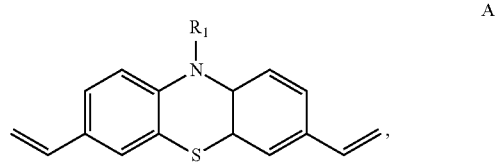

i.e., N-alkyl-3,7-divinyl phenothiazine,

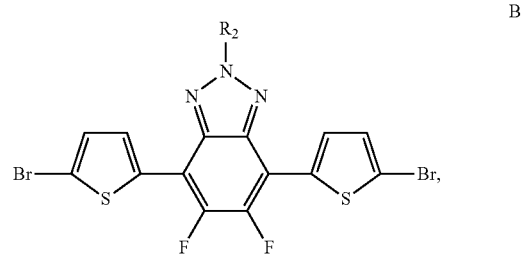

i.e., 2-alkyl-4,7-bis(5-bromo-thienyl)-5,6-difluoro-1,2,3-benzotriazole, where $R_1$ in the compound A is $C_1$ to $C_{20}$ alkyl, $R_2$ in the compound B is $C_1$ to $C_{20}$ alkyl.

Step S2, in an oxygen-free environment (e.g., an environment composed of nitrogen, argon, or a mixture of nitrogen and argon, etc.), the compound A and the compound B are added to an organic solvent containing a catalyst according to a molar ratio of 1:1. Then a Heck coupling reaction is performed for 24 to 96 hours at a temperature from 70° C. to 130° C. A reaction solution containing the product, i.e. the difluoro benzotriazolyl solar cell material represented by the formula (I), is obtained:

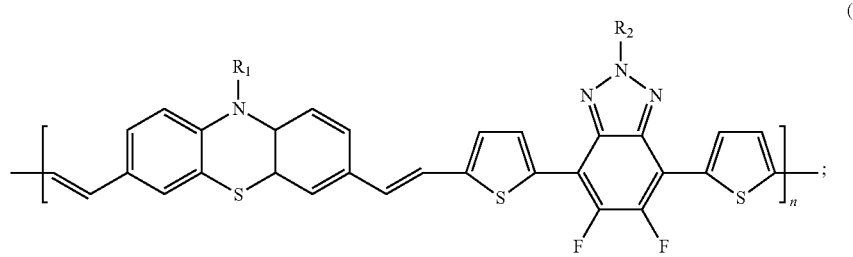

(I)

wherein n is an integer from 10 to 50.

Step S3, the product obtained in step S2 is purified according to the following procedures:

Methanol is added to the reaction solution of step S2, and the reaction solution is then precipitated, filtered by a Soxhlet extractor, and extracted and precipitated successively with methanol and n-hexane extraction for 24 hours. The reaction solution is then extracted and precipitated using chloroform as a solvent until the reaction solution is colorless. The chloroform solution is collected and rotary evaporated to obtain a red powder, which is then dried under vacuum at a temperature of 50° C. for 24 hours to obtain a purified difluoro benzotriazolyl solar cell material.

In step S2 of the preparation method, the catalyst is organic palladium, or the catalyst is a mixture of organic palladium and organic phosphorus ligand. A molar ratio between the organic palladium and the compound A is 1:20 to 1:100. The organic palladium is at least one selected from the group consisting of bis(triphenylphosphine) palladium(II)dichloride, tetrakis(triphenylphosphine)platinum, and palladium acetate. The organic phosphorus ligand is tri-o-tolyl phosphine, in the mixture of organic palladium and organic phosphorus ligand, a molar ratio between the organic palladium and the organic phosphorus ligand is 1:3 to 1:6.

The organic solvent is at least one selected from the group consisting of toluene, N,N-dimethylfolinamide, and tetrahydrofuran.

Preferably, in step S2, a reaction temperature of the Heck coupling reaction is from 90° C. to 120° C., a reaction time of the Heck coupling reaction is 48 to 72 hours.

In the difluoro benzotriazolyl solar cell material, since the 1,2,3-benzotriazole solar cell material contains two fluorine atoms, the HOMO energy level of the material is reduced by 0.11 eV, while the fluorine-substituted 1,2,3-benzotriazole has two imido groups with an electron-withdrawing ability; the fluorine-substituted 1,2,3-benzotriazole is a heterocyclic compound with a strong electron-withdrawing ability, and an alkyl chain can be easily introduced to the N-position of the N—H bond of the benzotriazole. The functional group of the alkyl chain can improve the solar energy conversion efficiency, thus solving the low efficiency problem of solar cells made of the solar cell material. In addition, the functional group of the alkyl chain can adjust the solubility of the difluoro benzotriazolyl solar cell material, so that the solar cell material is conducive to film forming processing, and its application range in the solar cell material or in the field of solar cell is expanded.

Furthermore, the preparation method of the present disclosure employs a relatively simple synthetic route, thereby simplifying the process; the manufacturing cost is reduced due to the inexpensive and readily available materials.

The foregoing difluoro benzotriazolyl solar cell material can be applied to the active layer of the organic solar cell.

For a better understanding of the present disclosure, the technical solution of the present disclosure is further illustrated by the specific examples and drawings, which includes the materials preparation and device fabrication. However, the specific examples are not intended to limit the scope of the present disclosure. The monomer of the compound A can be purchased from the market, the monomer of the compound B can be prepared according to the reference (*J. Am. Chem. Soc.* 2011, 133, 4625) or purchased from the market.

Example 1

The difluoro benzotriazolyl solar cell material of this example was poly {N-n-octyl-3,7-divinyl phenothiazine-co-2-n-octyl-4,7-dithienyl-5,6-difluorophenyl-benzotriazole}, where $R_1$ is n-octyl, $R_2$ is n-octyl, n is 40. The material had a following formula:

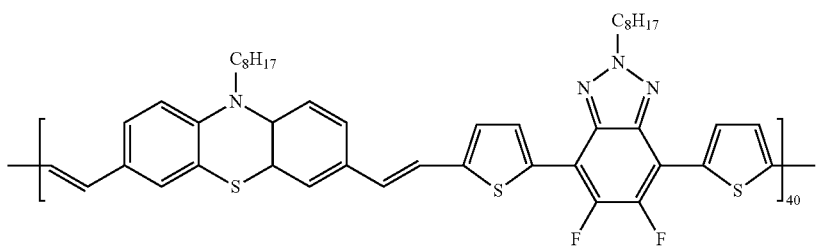

The preparation of the solar cell material included the steps of:

The reaction formula was shown as follows:

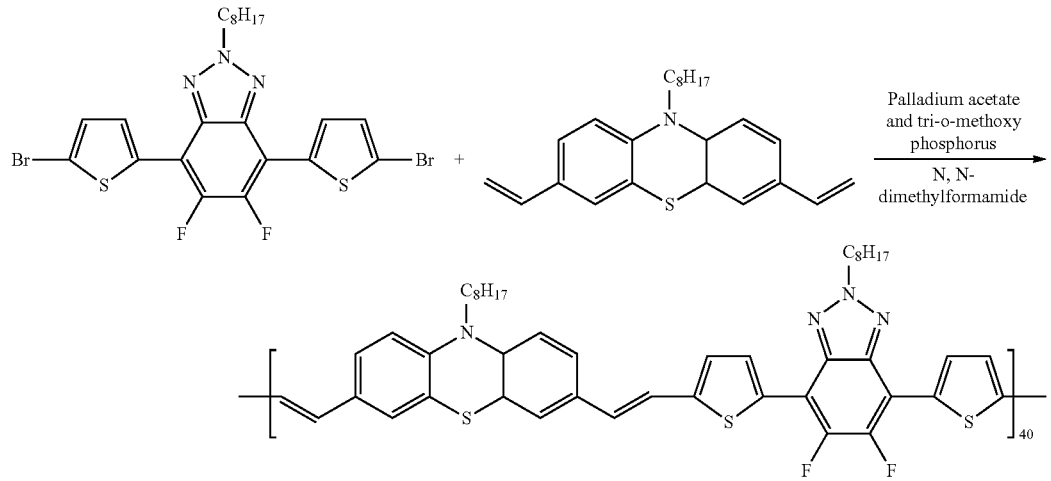

N-n-octyl-3,7-divinyl phenothiazine (109 mg, 0.3 mmol), 2-n-octyl-4,7-bis(5-bromo-thienyl)-5,6-difluoro-1,2,3-benzotriazole (176.8 mg, 0.3 mmol), palladium acetate (10.1 mg, 0.015 mmol), and tri-o-methoxy phosphorus (3 mg) were added to a flask containing 12 mL of N,N-dimethylformamide and were dissolved to form a solution. After the nitrogen was sufficiently introduced to the flask to exhaust the air for 30 min, a Heck coupling reaction was performed for 48 hours at a temperature of 120° C. with stirring, the polymerization reaction was stopped after cooling, and a reaction solution was obtained.

40 mL of methanol was added to the flask, the reaction solution was precipitated, filtrated by a Soxhlet extractor, then was successively extracted and precipitated with methanol and hexane for 24 hours. The reaction solution is then extracted and precipitated using chloroform as a solvent until the reaction solution is colorless. The chloroform solution was collected and rotary evaporated to obtain a red powder, which was then dried under vacuum at a temperature of 50° C. for 24 hours to obtain the poly {N-n-octyl-3,7-divinyl phenothiazine-co-2-n-octyl-4,7-dithienyl-5,6-difluorophenyl-benzotriazole} with a yield of 57%.

Test results: Molecular weight (GPC, THF, R. I): $M_n$=31.9 kDa, $M_w/M_n$=2.2.

Example 2

The difluoro benzotriazolyl solar cell material of this example was poly{N-methyl-3,7-divinyl phenothiazine-co-2-n-eicosyl-4,7-dithienyl-5,6-difluorophenyl-benzotriazole}, where $R_1$ is methyl, $R_2$ is n-eicosyl, n is 36. The material had a following formula:

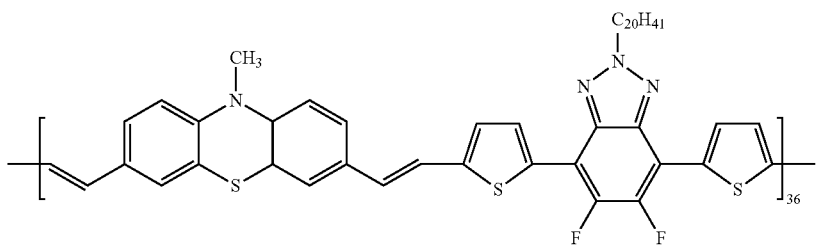

The preparation of the solar cell material included the steps of:

The reaction formula was shown as follows:

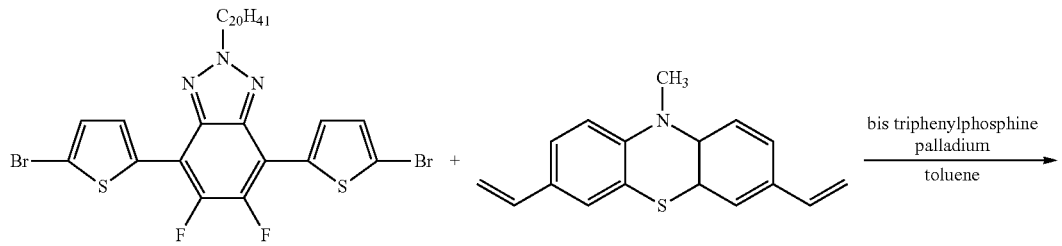

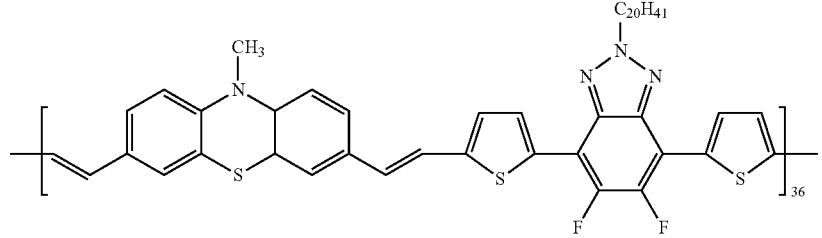

N-methyl-7-divinyl phenothiazine (53 mg, 0.2 mmol) and 2-eicosyl-4,7-bis(5-bromo-thienyl)-5,6-difluoro-1,2,3-benzotriazole (151.4 mg, 0.2 mmol) were added to a flask containing 15 mL of toluene and were dissolved to form a solution. The flask was evacuated to remove oxygen by introducing argon. After 5 mg of bis triphenylphosphine palladium dichloride was added to the flask, a Heck coupling reaction was performed for 72 hours at a temperature of 100° C. with stirring, the polymerization reaction was stopped after cooling, and a reaction solution was obtained.

50 mL of methanol was added to the flask, the reaction solution was precipitated, filtrated by a Soxhlet extractor, then was successively extracted and precipitated with methanol and hexane for 24 hours. The reaction solution is then extracted and precipitated using chloroform as a solvent until the reaction solution is colorless. The chloroform solution was collected and rotary evaporated to obtain a red powder, which was then dried under vacuum at a temperature of 50° C. for 24 hours to obtain the poly {N-methyl-3,7-divinyl phenothiazine-co-2-n-eicosyl-4,7-dithienyl-5,6-difluorophenyl-benzotriazole} with a yield of 57%.

Test results: Molecular weight (GPC, THF, R. I): $M_n$=30.8 kDa, $M_w/M_n$=2.2.

Example 3

The difluoro benzotriazolyl solar cell material of this example was poly {N-n-eicosyl-3,7-divinyl phenothiazine-co-2-methyl-4,7-dithienyl-5,6-difluoro-triazole}, where $R_1$ is n-eicosyl, $R_2$ is methyl, $R_2$, n is 30. The material had a following formula:

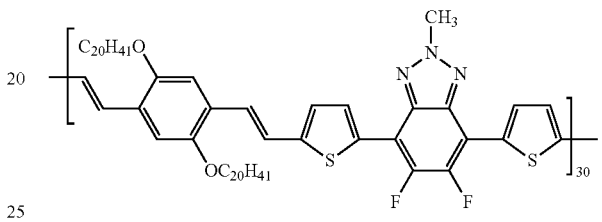

The preparation of the solar cell material included the steps of:

The reaction formula was shown as follows:

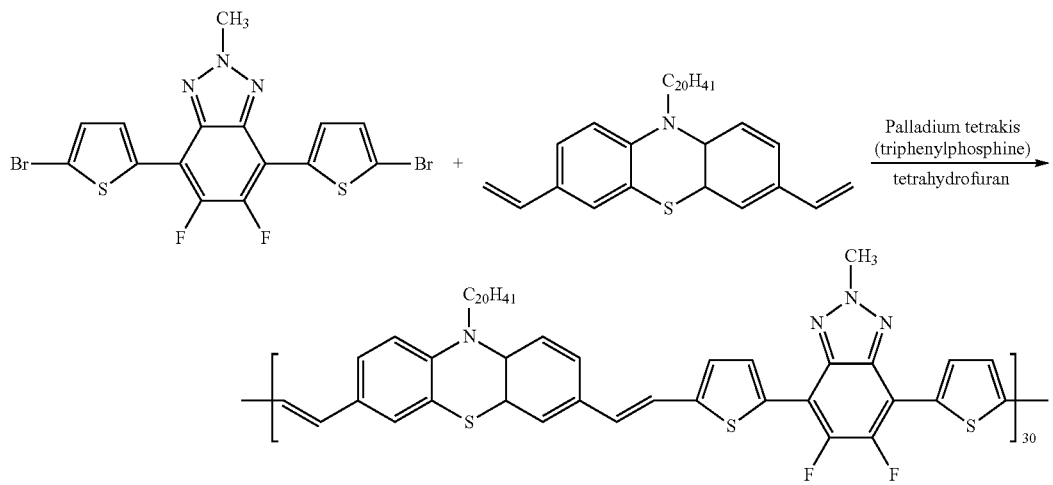

N-n-eicosyl-3,7-divinyl phenothiazine (160 mg, 0.3 mmol) and 2-methyl-4,7-bis(5-bromo-thienyl)-5,6-difluoro-1,2,3-benzotriazole (147.3 mg, 0.3 mmol) were added to a 50 mL two-necked flask containing 15 mL of tetrahydrofuran. A mixture of nitrogen and argon was introduced into the two-necked flask to exhaust air for approximately 20 minutes. After 17 mg of palladium tetrakis(triphenylphosphine) was added to the flask and approximately 10 minutes of exhausting air by the mixture of nitrogen and argon, a Heck coupling reaction was performed for 60 hours at a temperature of 90° C. with stirring, the polymerization reaction was stopped after cooling, and a reaction solution was obtained.

40 mL of methanol was added to the flask, the reaction solution was precipitated, filtrated by a Soxhlet extractor, then was successively extracted and precipitated with methanol and hexane for 24 hours. The reaction solution is then extracted and precipitated using chloroform as a solvent until the reaction solution is colorless. The chloroform solution was collected and rotary evaporated to obtain a red powder, which was then dried under vacuum at a temperature of 50° C. for 24 hours to obtain the poly {N-n-eicosyl-3,7-divinyl phenothiazine-co-2-methyl-4,7-dithienyl-5,6-difluoro-triazole} with a yield of 50%.

Test results: Molecular weight (GPC, THF, R. I): $M_n$=26.0 kDa, $M_w/M_n$=2.2.

Figure 2:
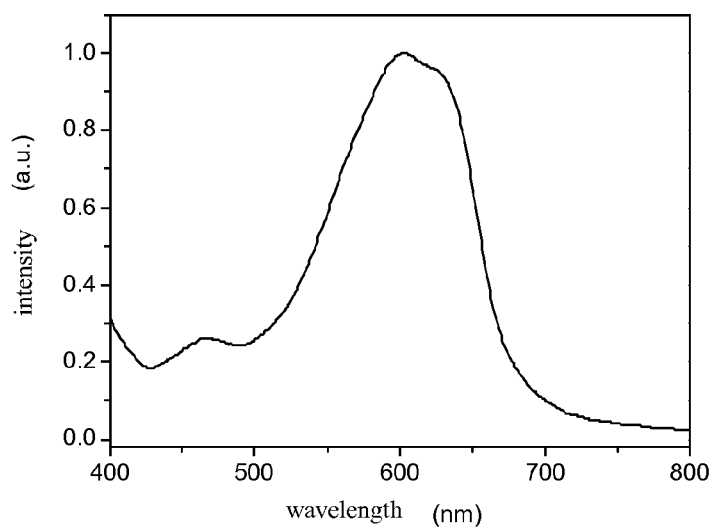
FIG. 2 is an ultraviolet visible absorption spectrum of poly{N-n-eicosyl alkyl-3,7-divinyl phenothiazine-co-2-methyl-4,7-dithienyl-5,6-difluorophenyl-benzotriazole} prepared according to Example 3.

FIG. 2 shows an ultraviolet visible absorption spectrum of poly {N-n-eicosyl-3,7-divinyl phenothiazine-co-2-methyl-4,7-dithienyl-5,6-difluoro-triazole} prepared according to the example 3, it can be seen from the FIG. 2 that the conjugated polymer has a strong absorption peak at about 600 nm.

Example 4

The difluoro benzotriazolyl solar cell material of this example was poly {N-tetradecyl-3,7-divinyl phenothiazine-co-2-n-decyl-4,7-dithienyl-5,6-difluoro-triazole}, where $R_1$ is n-tetradecyl, $R_2$ is N-decyl, n is 10. The material had a following formula:

N-tetradecyl-3,7-divinyl phenothiazine (78.6 mg, 0.2 mmol) and 2-n-decyl-4 7-bis(5-bromo-thienyl)-5,6-difluoro-1,2,3-benzotriazole (135 mg, 0.2 mmol) were added to a flask containing 15 mL of toluene and dissolved to form a solution. The flask was evacuated to remove oxygen by introducing argon. After bis triphenylphosphine palladium dichloride (0.01 mmol, 7.02 mg) was added to the flask, a Heck coupling reaction was performed for 24 hours at a temperature of 130° C. with stirring, the polymerization reaction was stopped after cooling, and a reaction solution was obtained.

50 mL of methanol was added to the flask, the reaction solution was precipitated, filtrated by a Soxhlet extractor, then was successively extracted and precipitated with methanol and hexane for 24 hours. The reaction solution is then extracted and precipitated using chloroform as a solvent until the reaction solution is colorless. The chloroform solution was collected and rotary evaporated to obtain a red powder, which was then dried under vacuum at a temperature of 50° C. for 24 hours to obtain the poly {N-tetradecyl-3,7-divinyl phenothiazine-co-2-n-decyl-4,7-dithienyl-5,6-difluoro-triazole} with a yield of 48%.

Test results: Molecular weight (GPC, THF, R. I): $M_n$=10.1 kDa, $M_w/M_n$=2.4.

Example 5

The difluoro benzotriazolyl solar cell material of this example was poly {N-n-butyl-3,7-divinyl phenothiazine-co-

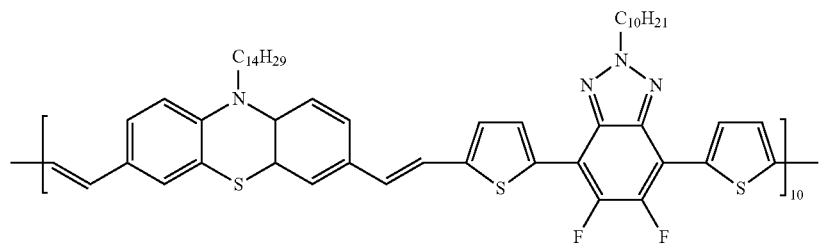

The preparation of the solar cell material included the steps of:
The reaction formula was shown as follows:

2-n-dodecyl-4,7-dithienyl-5,6-difluoro-triazole}, where $R_1$ is n-butyl, $R_2$ is n-dodecyl, 11 is 50. The material had a following formula:

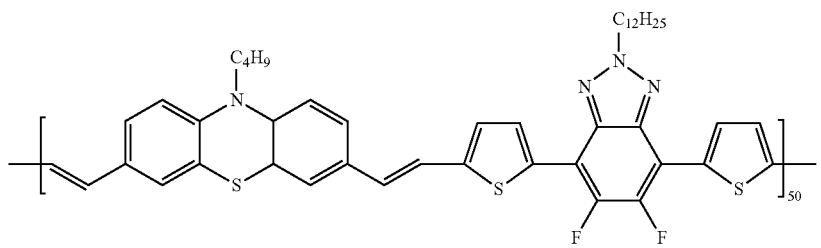

The preparation of the solar cell material included the steps of

The reaction formula was shown as follows:

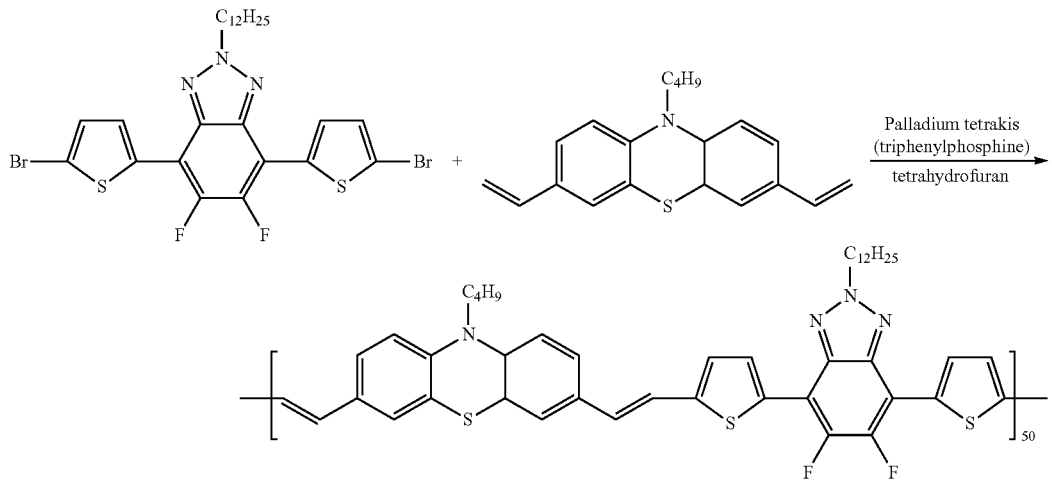

N-n-butyl-3,7-divinyl phenothiazine (93 mg, 0.3 mmol) and 2-dodecyl-4,7-bis(5-bromo-thienyl)-5,6-difluoro-1,2,3-benzotriazole (192.9 mg, 0.3 mmol) were added to a 50 mL two-necked flask containing 15 mL of tetrahydrofuran. A mixture of nitrogen and argon was introduced into the two-necked flask to exhaust air for approximately 20 minutes. After palladium tetrakis(triphenylphosphine) (0.003 mmol, 3.7 mg) was added to the flask, a Heck coupling reaction was performed for 96 hours at a temperature of 70° C. with stirring, the polymerization reaction was stopped after cooling, and a reaction solution was obtained.

40 mL of methanol was added to the flask, the reaction solution was precipitated, filtrated by a Soxhlet extractor, then was successively extracted and precipitated with methanol and hexane for 24 hours. The reaction solution is then extracted and precipitated using chloroform as a solvent until the reaction solution is colorless. The chloroform solution was collected and rotary evaporated to obtain a red powder, which was then dried under vacuum at a temperature of 50° C. for 24 hours to obtain the poly {N-n-butyl-3,7-divinyl phenothiazine-co-2-n-dodecyl-4,7-dithienyl-5,6-difluoro-triazole} with a yield of 72%.

Test results: Molecular weight (GPC, THF, R. I): $M_n$=39.6 kDa, $M_w/M_n$=2.1.

Example 6

A organic solar cell of the present example employed poly {N-n-eicosyl-3,7-divinyl phenothiazine-co-2-methyl-4,7-dithienyl-5,6-difluoro-triazole} (i.e. DFBTz-PTZ3) prepared according to Example 3 as an electron donor material for an active layer.

Figure 3:
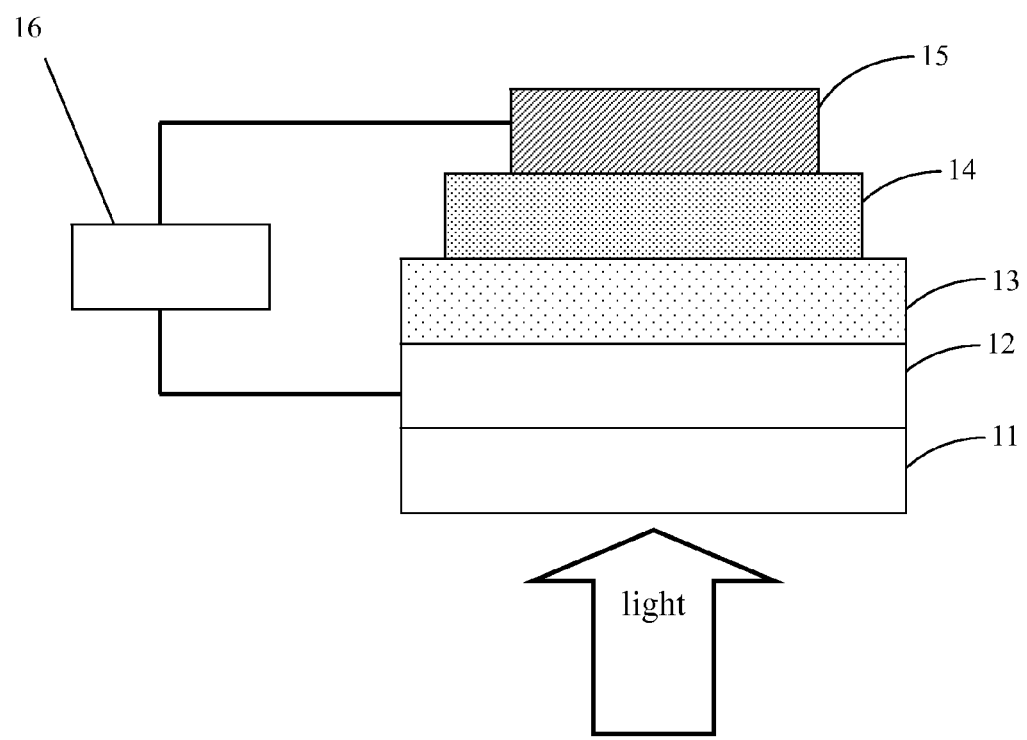
FIG. 3 is a schematic structure view of the organic solar cell according to Example 4.

Referring to FIG. 3, the organic solar cell device includes a glass substrate 11, a transparent anode 12, an intermediate auxiliary layer 13, an active layer 14, and a cathode 15, which are laminated in that order. The transparent anode 12 can be made of indium tin oxide (abbreviation as ITO), preferably the indium tin oxide with a sheet resistance of 10-200/sq. The intermediate auxiliary layer 13 is made of a composite of poly 3,4-ethylenedioxythiophene and poly styrene sulfonate (abbreviation as PEDOT: PSS). The active layer 14 includes an electron donor material and an electron acceptor material. The electron donor material is the polymer obtained from the example 1 (i.e. DFBTz-PTZ3); the electron acceptor material can be [6,6]-phenyl-$C_{61}$-butyric acid methyl ester (abbreviation as PCBM). The cathode 15 can be aluminum electrode or double-layer metal electrode, such as Ca/Al or Ba/Al and so on, the thickness of the cathode 15 is preferably 170 nm, 30 mm, 130 nm or 60 nm.

The glass substrate 11 can be used as a bottom layer. In fabrication, the ITO glass is cleaned by ultrasonic and treated with oxygen-Plasma, and then spin-coated with the intermediate auxiliary layer 13. The polymer obtained from the Example 1 and the electron acceptor material are mixed and coated on the intermediate auxiliary layer 13 to form the active layer 14, and then the cathode 15 is deposited on the active layer 14 by vacuum deposition techniques, such that the organic solar cell device is obtained. The organic solar cell is then heated for 4 hours at 110° C. under an airtight condition, and cooled to room temperature. Such an annealing process can effectively increase the arranged orderliness and regularity of each group in the molecule and the molecular chain segments, and the carrier mobility and efficiency of the transmission speed are improved, thereby improving the photoelectric conversion efficiency. In the illustrated embodiment, the thickness of the Al layer of the cathode 15 is 170 nm.

Referring to the FIG. 3, under illumination, the light passes through the glass substrate 11 and the ITO electrode 12, then the light energy is absorbed by the hole-conduction type electroluminescent material of the active layer 14, and excitons are generated. The excitons then migrate to an interface between the electron donor and acceptor materials, and transfer the electrons to the electron acceptor material, such as PCBM, therefore the charges are separated, thereby forming the free carriers, i.e. the free electrons and the holes. The free electrons are transferred to the cathode along the electron acceptor material and are collected by the cathode, the free holes are transferred along the electron donor material and are collected by the anode, thereby forming the photocurrent and photovoltage, and photoelectric conversion is achieved. When a load 16 is connected, the solar cell is capable of supplying power. Since the hole-conduction type electroluminescent material has a wide spectral response range, the light energy is fully utilized to obtain much higher photoelectric conversion efficiency, and the power generation capacity of the organic solar cell is increased. In addition, this type of the organic material can also reduce the weight of the organic solar cell, it can be made by spin coating technology for mass production.

The photovoltaic properties of the organic solar cell of Example 6 are shown in Table 1 (Note: PCE represents the power conversion efficiency, $V_{oc}$, represents the open circuit voltage, $J_{sc}$ represents the short circuit current, FF represents the fill factor.)

TABLE 1

| | $V_{oc}$(V) | $J_{sc}$(mA/cm$^2$) | FF (%) | PCE(%) |
|---|---|---|---|---|
| DFBTz-PPV1/PCBM | 0.70 | 9.39 | 46.7 | 3.1 |

As can be seen from Table 1, under an illumination of AM1.5, 100 mW/cm$^2$, the energy conversion efficiency of the bulk-heterojunction solar cell based on the DFBTz-PTZ3 as the electron donor material is 3.2%, where AM means the air mass, which is represented by the ratio between the optical path-length of solar beam through the atmosphere relative to the optical path-length of the solar beam at zenith reaching to the sea level. The AM 1.5 condition means the irradiance and spectral distribution for calibrating and testing the terrestrial solar cell; the total solar irradiance is 1000 Watts per square meter, the measured temperature of the solar cell is 25° C.; the standard is enacted by the International Electrotechnical Commission, which is the currently standard in our country, specifically, one standard solar corresponds to the irradiation strength of the AM1.5 G standard light source, AM1.5 G represents the sunlight with a 48° zenith angle (the angle between the incident light from the incident light source and the normal of the earth), the light intensity is 1000 W/m$^2$ (i.e. AM1.5, 100 mW/cm$^2$ illumination).

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A difluoro benzotriazolyl solar cell material, represented by formula (I),

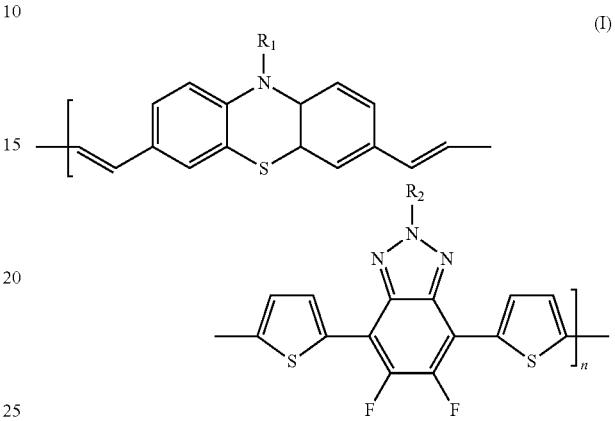

wherein $R_1$ and $R_2$ are $C_1$ to $C_{20}$ alkyl, n is an integer from 10 to 50.

2. The difluoro benzotriazolyl solar cell material according to claim 1, wherein n is from 30 to 40.

3. A method of preparing a difluoro benzotriazolyl solar cell material, comprising the following steps:

step S1, providing compounds A and B represented by the following formulas,

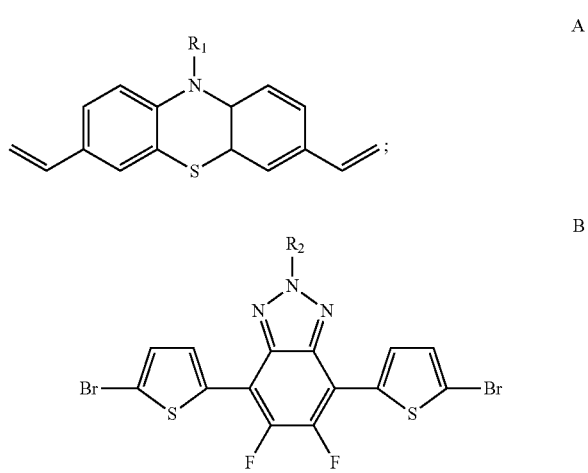

wherein $R_1$ in the compound A is $C_1$ to $C_{20}$ alkyl, $R_2$ in the compound B is $C_1$ to $C_{20}$ alkyl;

step 2, adding the compound A and the compound B to an organic solvent containing a catalyst according to a molar ratio of 1:1 in an oxygen-free environment, performing a Heck coupling reaction for 24 to 96 hours at a temperature from 70° C. to 130° C., then obtaining the difluoro benzotriazolyl solar cell material represented by formula (I):

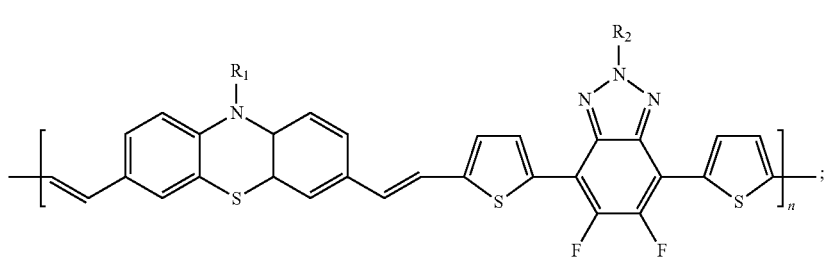

(I)

wherein n is an integer from 10 to 50.

4. The method according to claim 3, further comprising:
step S3, purifying the difluoro benzotriazolyl solar cell material obtained from step S2.

5. The method according to claim 3, wherein the catalyst in step S2 is organic palladium, or the catalyst is a mixture of organic palladium and organic phosphorus ligand.

6. The method according to claim 5, wherein the organic palladium is at least one selected from the group consisting of bis(triphenylphosphine) palladium(II)dichloride, tetrakis (triphenylphosphine)platinum, and palladium acetate; the organic phosphorus ligand is tri-o-tolyl phosphine.

7. The method according to claim 5, wherein a molar ratio between the organic palladium and the compound A is 1:20 to 1:100.

8. The method according to claim 3, wherein the organic solvent in step S2 is at least one selected from the group consisting of toluene, N,N-dimethylformamide, and tetrahydrofuran.

9. The method according to claim 3, wherein in step S2, a reaction temperature of the Heck coupling reaction is 90° C. to 120° C., a reaction time of the Heck coupling reaction is 48 to 72 hours.

10. An organic solar cell, comprising a difluoro benzotriazolyl solar cell material according to claim 1.

11. The method according to claim 4, wherein the catalyst in step S2 is organic palladium, or the catalyst is a mixture of organic palladium and organic phosphorus ligand.

12. The method according to claim 11, wherein the organic palladium is at least one selected from the group consisting of bis(triphenylphosphine) palladium(II)dichloride, tetrakis (triphenylphosphine)platinum, and palladium acetate; the organic phosphorus ligand is tri-o-tolyl phosphine.

13. The method according to claim 11, wherein a molar ratio between the organic palladium and the compound A is 1:20 to 1:100.

14. The method according to claim 4, wherein the organic solvent in step S2 is at least one selected from the group consisting of toluene, N,N-dimethylformamide, and tetrahydrofuran.

15. The method according to claim 4, wherein in step S2, a reaction temperature of the Heck coupling reaction is 90° C. to 120° C., a reaction time of the Heck coupling reaction is 48 to 72 hours.

* * * * *